United States Patent
Liu et al.

(10) Patent No.: US 11,323,121 B2
(45) Date of Patent: May 3, 2022

(54) PROGRAMMABLE DEVICE STRUCTURE BASED ON MIXED FUNCTION STORAGE UNIT

(71) Applicant: HERCULES MICROELECTRONICS CO., LTD., Beijing (CN)

(72) Inventors: Chengli Liu, Beijing (CN); Haili Wang, Beijing (CN); Zixian Chen, Beijing (CN); Ming Ma, Beijing (CN)

(73) Assignee: HERCULES MICROELECTRONICS CO., LTD., Beijing (CN)

( * ) Notice: Subject to any disclaimer, the term of this patent is extended or adjusted under 35 U.S.C. 154(b) by 58 days.

(21) Appl. No.: 16/769,152

(22) PCT Filed: Jan. 8, 2018

(86) PCT No.: PCT/CN2018/071735
§ 371 (c)(1),
(2) Date: Jun. 2, 2020

(87) PCT Pub. No.: WO2019/114069
PCT Pub. Date: Jun. 20, 2019

(65) Prior Publication Data
US 2021/0218403 A1    Jul. 15, 2021

(30) Foreign Application Priority Data
Dec. 13, 2017  (CN) .......................... 201711329510.3

(51) Int. Cl.
*H03K 19/17*    (2006.01)
*H03K 19/1776*  (2020.01)
(Continued)

(52) U.S. Cl.
CPC ......... *H03K 19/1776* (2013.01); *G06F 30/34* (2020.01); *G11C 11/418* (2013.01)

(58) Field of Classification Search
CPC ... H03K 19/1776; G06F 30/34; G06F 30/347; G06F 30/327; G06F 2117/08; G11C 11/418
See application file for complete search history.

(56) References Cited

U.S. PATENT DOCUMENTS 7,535,252 B1 *  5/2009  Teig .................... G06F 30/3323
                                             326/38
8,539,011 B1 *  9/2013  Taylor .............. H03K 19/17728
                                             708/232
(Continued)

FOREIGN PATENT DOCUMENTS

CN      1751361 A     3/2006
CN    102176673 A     9/2011
(Continued)

OTHER PUBLICATIONS

International Search Report (PCT/ISA/210) dated Sep. 12, 2018, by the State Intellectual Property Office of the P.R. China as the International Searching Authority for International Application No. PCT/CN2018/071735.
(Continued)

*Primary Examiner* — Ajay Ojha
(74) *Attorney, Agent, or Firm* — Buchanan Ingersoll & Rooney PC

(57) ABSTRACT

A programmable device structure based on a mixed function storage unit includes a storage unit SRAM and a mixed function unit, wherein the storage unit comprises n register units and at least one selection control bit, wherein $n=2^x$, and x is natural number; the register units are selected according to the selection control bit; and when the selection control bit selects the mixed function unit to serve as a lookup table, a logic function is achieved; or when the selection control bit selects the mixed function unit to serve as a multiplexer, a routing function is achieved. By multi-
(Continued)

plexing the register units, the programmable device structure achieves a routing function of a traditional FPGA and also provides a logic function, and the waste of resources is greatly reduced.

6 Claims, 3 Drawing Sheets

(51) Int. Cl.
    *G06F 30/34*     (2020.01)
    *G11C 11/418*     (2006.01)

(56) References Cited

U.S. PATENT DOCUMENTS

| | | |
|---|---|---|
| 2006/0158218 A1 | 7/2006 | Leijten-Nowak |
| 2008/0094103 A1 | 4/2008 | Dasari et al. |
| 2016/0065213 A1* | 3/2016 | Patil ................ H03K 19/17728 326/38 |

FOREIGN PATENT DOCUMENTS

| | | |
|---|---|---|
| CN | 102866865 A | 1/2013 |
| CN | 103632726 A | 3/2014 |

OTHER PUBLICATIONS

Written Opinion (PCT/ISA/237) dated Sep. 12, 2018, by the State Intellectual Property Office of the P.R. China as the International Searching Authority for International Application No. PCT/CN2018/071735.

* cited by examiner

PROGRAMMABLE DEVICE STRUCTURE BASED ON MIXED FUNCTION STORAGE UNIT

BACKGROUND OF THE INVENTION

Technical Field

The invention relates to integrated circuits, in particular to a mixed function storage unit structure based on an FPGA.

Description of Related Art

In SRAM-BASED programmable devices, 25% of the area is used for the configuration of register unit sram-bits, there is still about 50% of the area left unoccupied and unused after routing of the sram-bits, and consequentially, the waste of resources is caused.

BRIEF SUMMARY OF THE INVENTION

The objective of the invention is to provide a structure which can achieve a routing function and a logic structure by means of remaining SRAM-BITS of an FPGA. The structure can automatically control, by software, corresponding SRAM-BITS to achieve the routing function and corresponding SRAM-BITS to achieve the logic function according to the requirements for logic units and path-selection MUXs in the FPGA.

To fulfill the above objective, the invention provides a programmable device structure based on a mixed function storage unit. The programmable device structure comprises a storage unit SRAM and a mixed function unit, wherein the storage unit comprises n register units and at least one selection control bit, $n=2^x$, and x is a natural number; the register units are selected according to the selection control bit; when the mixed function unit is selected by the selection control bit to serve as a lookup table, a logic function is achieved; or, when the mixed function unit is selected by the selection control bit to serve as a multiplexer, a routing function is achieved.

Preferably, when the selection control bit is a first flag bit, the mixed function unit is used as a lookup table to achieve the logic function; and when the selection control bit is a second flag bit, the mixed function unit is used as a multiplexer to achieve the routing function.

Preferably, the mixed function unit comprises an input selection unit, a control selection unit, a mixed module and a multi-path selection module, wherein the input selection module comprises 2n one-of-out-two units, and two input terminals of the 2n one-of-out-two units are connected to the register units in a one-to-one correspondence manner to output mixed input bits; and the control selection unit comprises k one-of-out-two units, wherein k=1+x, first input terminals of the k one-of-out-two units are correspondingly connected to the register units, and second input terminals of the k one-of-out-two units receive external input signals and output mixed selection bits.

Preferably, the mixed module comprises k layers of COMS transmission gates. A first layer includes 2n COMS transmission gates, wherein every two adjacent COMS transmission gates form a group, an input terminal of a first COMS transmission gate in each group is forward connected to an output of the input selection unit, and an input terminal of a second COMS transmission gate in each group is reversely connected to an output of the input selection unit, and output terminals of the two COMS transmission gates in each group are connected to serve as a common output of the whole group. A second layer includes n COMS transmission gates, wherein every two adjacent COMS transmission gates form a group, an input terminal of a first COMS transmission gate in each group is forward connected to one set of outputs from the first layer, a second COMS transmission gate in each group is reversely connected to the other set of outputs from the first layer, and output terminals of the two COMS transmission gates in each group are connected to serve as a common output of the whole group. By analogy, a $k^{th}$ layer includes two COMS transmission gates, wherein an input terminal of a first COMS transmission gate is forward connected to one set of outputs from the previous layer, a second COMS transmission gate is reversely connected to the other set of outputs from the previous layer, and output terminals of the two COMS transmission gates are connected to serve as a common output.

Preferably, each of the k layers of COMS transmission gates in the mixed module is controlled by one mixed selection bit to be gated.

Preferably, the multi-path selection module comprises x multiplexers. Each multiplexer comprises k layers of COMS transmission gates, wherein a first layer includes 2n COMS transmission gates, every two adjacent COMS transmission gates form a group, an input terminal of a first COMS transmission gate in each group forward receives an external routing input signal, an input terminal of a second COMS transmission gate in each group reversely receives an external routing input signal, output terminals of the two COMS transmission gates in each group are connected to serve as a common output of the whole group; a second layer includes n COMS transmission gates, every two adjacent COMS transmission gates form a group, an input terminal of a first COMS transmission gate in each group is forward connected to one set of outputs from the first layer, a second COMS transmission gate in each group is reversely connected to the other set of outputs from the first layer, and output terminals of the two COMS transmission gates in each group are connected to form a common output of the whole group; by analogy, a $k^{th}$ layer includes two COMS transmission gates, an input terminal of a first COMS transmission gate is forward connected to one set of outputs from the previous layer, a second COMS transmission gate is reversely connected to the other set of outputs from the previous layer, and output terminals of the two COMS transmission gates are connected to serve as a common output.

Preferably, each of the k layers of COMS transmission gates in the multi-path selection module is controlled by the storage unit to be gated.

Preferably, the mixed function unit is implemented by means of a hardware description language Verilog.

According to the invention, by multiplexing the register units, a routing function of a traditional FPGA is achieved, a logic function is provided, and the waste of resources is greatly reduced.

DETAILED DESCRIPTION OF THE INVENTION

The technical solutions of the invention are further expounded below in combination with the accompanying drawings and embodiments.

Figure 1:
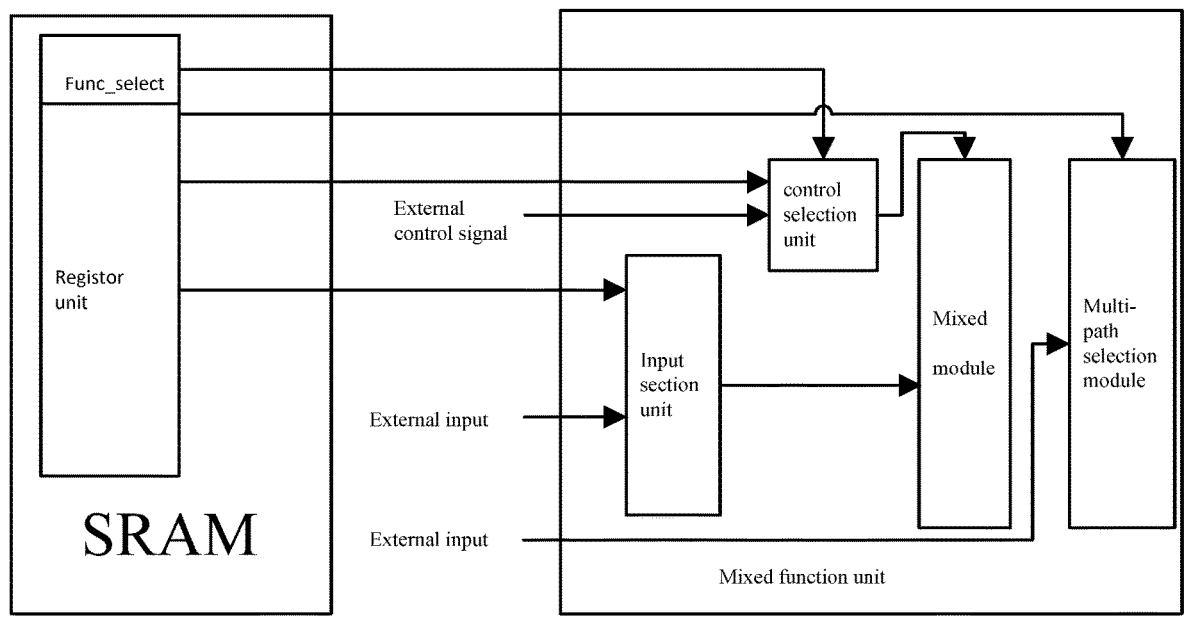
FIG. 1 is a schematic diagram of a programmable device structure based on a mixed function storage unit.

FIG. 1 is a schematic diagram of a programmable device structure based on a mixed function storage unit.

As shown in FIG. 1, an embodiment of the invention provides a programmable device structure based on a mixed function storage unit. The programmable device structure comprises a storage unit SRAM and a mixed function unit, wherein the storage unit comprises n register unit and at least one selection control bit, wherein $n=2^x$, and x is a natural number; the register units are selected according to the selection control bit; when the control selection bit selects the mixed function unit to serve as a lookup table, a logic function is achieved; or, when the selection control bit selects the mixed function unit to serve as a multiplexer, a routing function is achieved.

Figure 2:
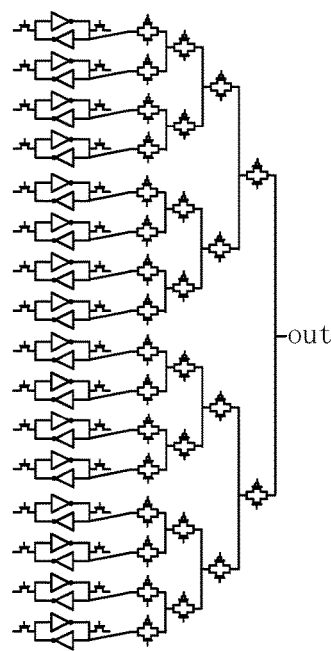
FIG. 2 is a schematic diagram of an existing logic function.

FIG. 2 is a schematic diagram of an existing logic function.

As shown in FIG. 2, sixteen register units are provided to achieve the function of logic lookup table in the prior art, and each register unit stores corresponding data. The register units are in one-to-one correspondence of COMS transmission gates in a first layer, and the first layer includes sixteen COMS transmission gates. In the first layer, every two adjacent COMS transmission gates form a group, have opposite connection directions, and achieve a one-out-of-two function according to a control signal z0. A second layer includes eight COMS transmission gates, receiving terminals of the eight COMS transmission gates receive output results from the first layer, and the one-out-of-two function is achieved according to a control signal z1. By analogy, a fourth layer includes two COMS transmission gates which receive output results from COMS transmission gates in a third layer and achieve the one-out-of-two function according to a control signal z3, so that a unique result is output. In this way, any logic for control over any four inputs is realized.

Figure 3:
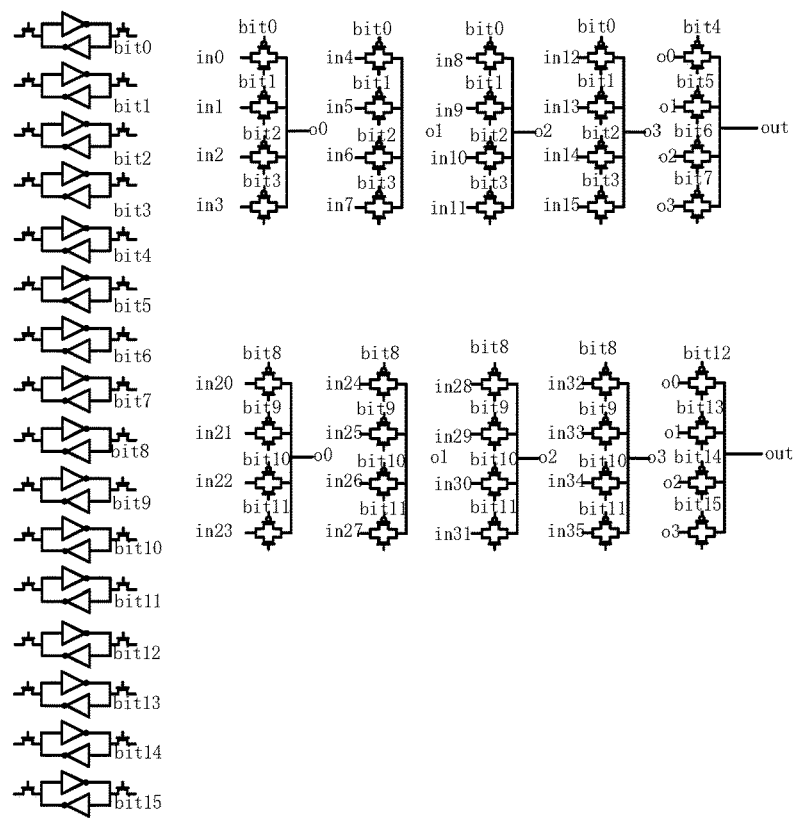
FIG. 3 is a schematic diagram of an existing multiplexer function.

FIG. 3 is a schematic diagram of an existing multiplexer function.

As shown in FIG. 3, two one-out-of-sixteen MUXs are provided to achieve a multiplexer function in the prior art, wherein each MUX is divided into five one-out-of-four groups. Each one-out-of-four group includes four COMS transmission gates. Input terminals of the first, second, third and fourth groups receive input signals. The COMS transmission gates, at the same position, in the four groups receive the same control signal from the SRAM and are controlled by the control signal to be gated. Four input signals received by the first group are respectively in0, in1, in2 and in3 and are respectively controlled by bit0, bit1, bit2 and bit3, and a signal o0 is output. Four input signals received by the second group are respectively in4, in5, in6 and in7 and are respectively controlled by bit0, bit1, bit2 and bit3, and a signal o1 is output. Four input signals received by the third group are respectively in8, in9, in10 and in11 and are respectively controlled by bit0, bit1, bit2 and bit3, and a signal o2 is output. Four input signals received by the fourth group are respectively in12, in13, in14 and in15 and are respectively controlled by bit0, bit1, bit2 and bit3, and a signal o3 is output. Four input signals received by the fifth group are respectively the output signals o0, o1, o2 and o3 of the former four groups and are respectively controlled by bit4, bit5, bit6 and bit7, and finally, a unique signal is output. When the function of one multiplexer is achieved in the prior art, eight bit control signals are used to control the gating of any sixteen input signals. In the case where sixteen bit control signals are provided, the function of two one-out-of-sixteen multiplexers can be achieved.

Figure 4:
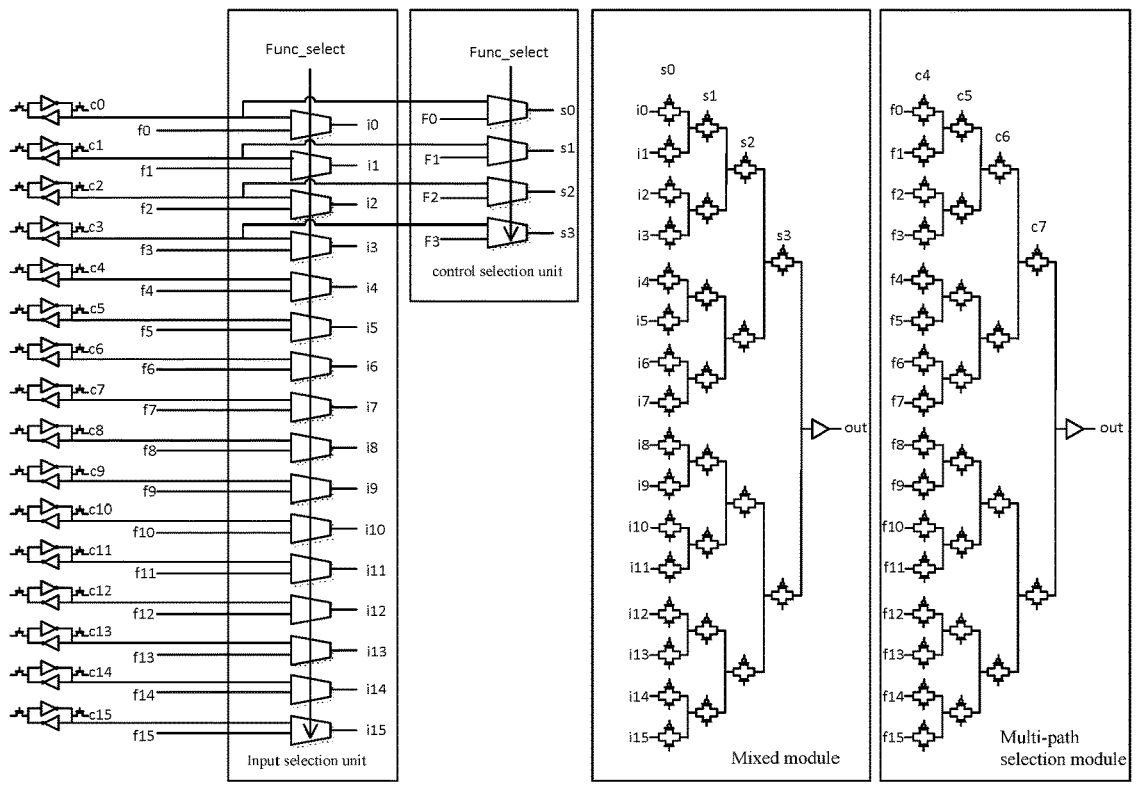
FIG. 4 is a circuit diagram of a programmable device structure based on a mixed function storage unit in an embodiment of the invention.

FIG. 4 is a circuit diagram of a programmable device structure based on a mixed function storage unit in an embodiment of the invention.

As shown in FIG. 4, SRAM bits on the left of the figure are used for storing corresponding data. Wherein, SRAM bits c0-c15 are input signals of a mixed module when the mixed module is used as a lookup table (LUT). F0-f15 are input signals of the mixed module when the mixed module is used as multiplexers (MUXs). Each register unit in the SRAM is correspondingly connected to an input terminal of one one-out-of-two MUX in an input selection unit, the other input terminals of the one-out-of-two MUXs in the input selection unit receive external routing input signals f0-f15 which are selected to serve as control signals of the one-out-of-two MUXs in the input selection unit through a selection control bit Func_select, and input signals i0-i15 of the mixed module are output. First input terminals of the four one-out-of-two MUXs in the control selection unit receive c0-c3 of the SRAM, second input terminals of the four one-out-of-two MUXs in the control selection unit receive any four external inputs F0-F3 which are used as control signals of one-out-of-two MUXs in a control selection unit through a selection control bits Func_select, and control signals s0-s3 of the mixed module are output.

The mixed module comprises four layers of COMS transmission gates. Wherein, the COMS transmission gates in the first layer receive output signals i0-i15 from the input selection unit; and every two adjacent COMS transmission gates in the first layer form a group, have opposite connection directions and achieve a one-out-of-two function according to a control signal s0. The second layer includes eight COMS transmission gates, receiving terminals of the eight COMS transmission gates receive output results from the first layer, and the one-out-of-two function is achieved according to a control signal s1. By analogy, the fourth layer includes two COMS transmission gates which receive output results from the COMS transmission gates in the third layer and achieve the one-out-of-two function according to a control signal s3, so that a unique result is output.

Clearly, the SRAM provides sixteen inputs in this embodiment, and those skilled in the art would appreciate that 2n inputs can be provided, wherein $n=2^x$, and x is a natural number, and that k layers of COMS transmission gates can be configured, wherein $k=1+x$.

In another embodiment, in the case of 2n inputs, the first layer includes 2n COMS transmission gates, wherein every two adjacent COMS transmission gates form a group, an input terminal of a first COMS transmission gate in each group is forward connected to an output of the input selection unit, an input terminal of a second COMS transmission gate in each group is reversely connected to an output of the input selection unit, output terminals of the two COMS transmission gates in each group are connected to serve as a common output of the whole group;

The second layer includes n COMS transmission gates, wherein every two adjacent COMS transmission gates form a group, an input terminal of a first COMS transmission gate in each group is forward connected to one set of outputs from the first layer, a second COMS transmission gate in each group is reversely connected to the other set of outputs from the first layer, and output terminals of the two COMS transmission gates in each group are connected to serve as a common output of the whole group.

By analogy, the $k^{th}$ layer includes two COMS transmission gates, wherein an input terminal of a first COMS transmission gate is forward connected to one set of outputs from the previous layer, a second COMS transmission gate is reversely connected to the other set of outputs from the previous layer, and output terminals of the two COMS transmission gates are connected to serve as a common output.

A multi-path selection module comprises at least one multiplexer (only one is shown in the figure), and the multiplexers are similar in structure and have different control signals. The multiplexer comprises four layers of COMS transmission gates. The COMS transmission gates in each layer perform gating control according to the SRAM bits, and every two adjacent COMS transmission gates form a group and have opposite connection directions. The COMS transmission gates in the first layer receive external routing input signals f0-f15 and achieve a one-out-of-two function according to a control signal c4. The second layer includes eight COMS transmission gates, and receiving terminals of the eight COMS transmission gates receive output results from the first layer and achieve the one-out-of-two function according to a control signal c5. By analogy, the fourth layer includes two COMS transmission gates which receive output results from the COMS transmission gates in the third layer and achieve the one-out-of-two function according to a control signal c7, so that a unique result is output.

In this embodiment, the multi-path selection module may further comprise another two multiplexers (not shown), and control signals of these two multiplexers are respectively c8-c11 and c12-c15. Wherein, the number of the multiplexers can be properly selected according to the number of the SRAM bits.

Clearly, the logic for sixteen inputs is provided in this embodiment, and those skilled in the art would appreciate that the multi-path selection module may also comprise X multiplexers. Each multiplexer comprises k layers of COMS transmission gates, wherein the first layer includes 2n COMS transmission gates, every two adjacent COMS transmission gates form a group, an input terminal of the first COMS transmission gate in each group forward receives an external routing input signal, an input terminal of the second COMS transmission gate in each group reversely receives an external routing input signal, and output terminals of the two COMS transmission gates in each group are connected to serve as a common output of the whole group.

The second layer includes n COMS transmission gates, wherein every two adjacent COMS transmission gates form a group, an input terminal of the first COMS transmission gate in each group is forward connected to a set of outputs from the first layer, the other COMS transmission gate in each group is reversely connected to the other set of outputs from the first layer, and output terminals of the two COMS transmission gates in each group are connected to serve as a common output of the whole group;

By analogy, the $k^{th}$ layer includes two COMS transmission gates, an input terminal of the first COMS transmission gate is forward connected to a set of outputs from the previous layer, the second COMS transmission gate is reversely connected to the other set of outputs from the previous layer, and output terminals of the two COMS transmission gates are connected to serve as a common output.

Figure 5:
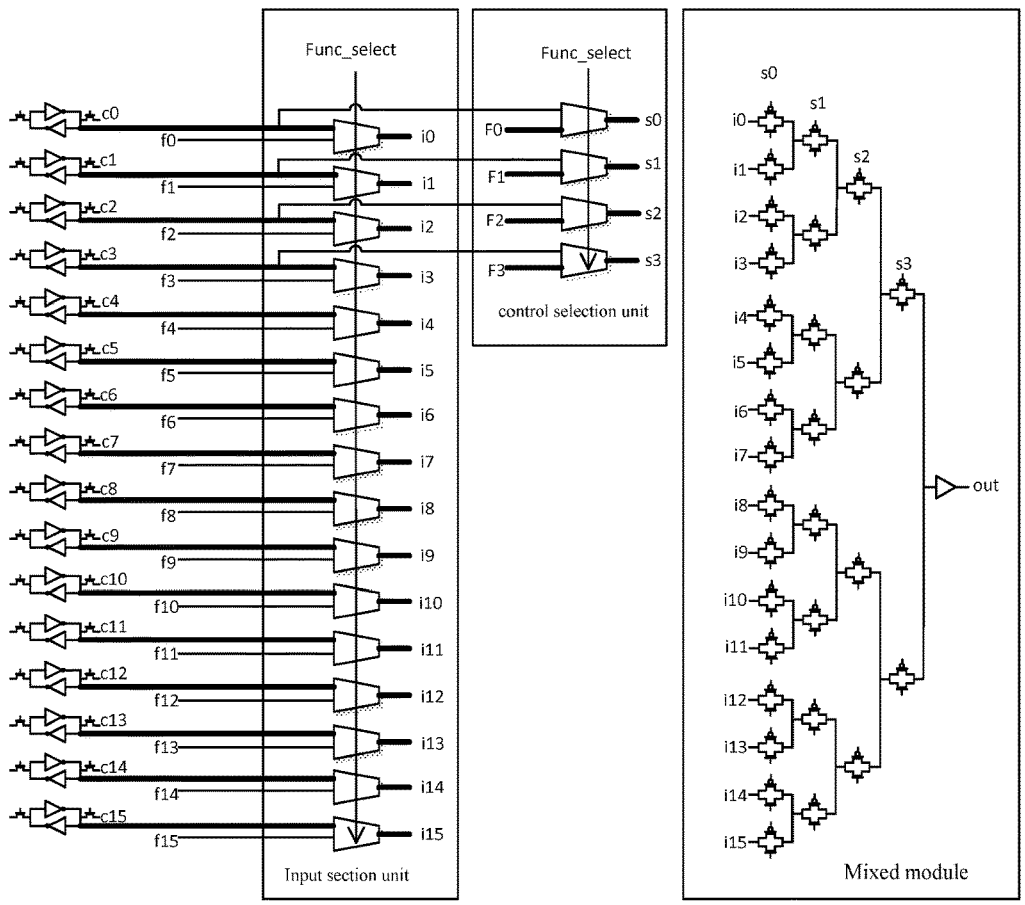
FIG. 5 is a schematic diagram of a mixed function unit for achieving a logic function in an embodiment of the invention.

FIG. 5 is a schematic diagram of the mixed function unit for achieving a logic function in an embodiment of the invention.

In an embodiment, as shown in FIG. 5, signal transmission between the mixed function unit and the storage unit when the logic function is achieved is highlighted in bold. In this embodiment, 0 is selected as a first flag bit, and 1 is selected as a second flag bit. When the selection control bit is 0, the one-out-of-two MUXs in the input selection unit select SRAM bits c0-c15 as outputs i0-i15, and the one-out-of-two MUXs in the control selection unit select any four external inputs F0-F3 as outputs s0-s3. At this moment, only the mixed module works as an LUT, and the multi-path selection module stops working.

The COMS transmission gates in the first layer of the mixed module receive the output signals i0-i15 from the input selection unit, wherein the values of i0-i15 are c0-c15 used for storing preset operation results. In the first layer, every two adjacent COMS transmission gates form a group, have opposite connection directions and achieve the one-out-of-two function according to a control signal s0. The second layer includes eight COMS transmission gates, receiving terminals of the eight COMS transmission gates receive output results from the first layer, and the one-out-of-two function is achieved according to a control signal s1. By analogy, the fourth layer includes two COMS transmission gates which receive output results from the COMS transmission gates in the third layer and achieve the one-out-of-two function according to a control signal s3, so that a unique result is output, and a corresponding logic operation result is obtained. Wherein, the values of s0-s3 are any four inputs F0-F3, and one of the pre-stored values c0-c15 is selected by performing a logic operation on any four inputs F0-F3, that is, the mixed module achieves the logic function for any four inputs.

Clearly, sixteen SRAM bits are configured in this embodiment to implement the logic of any four inputs, and those skilled in the art would appreciate that 2n SRAM bits may be configured, wherein n=$2^x$, and x is a natural number, and that k layers of COMS transmission gates may be configured to achieve the logic function for any k inputs, wherein k=1+x.

Figure 6:
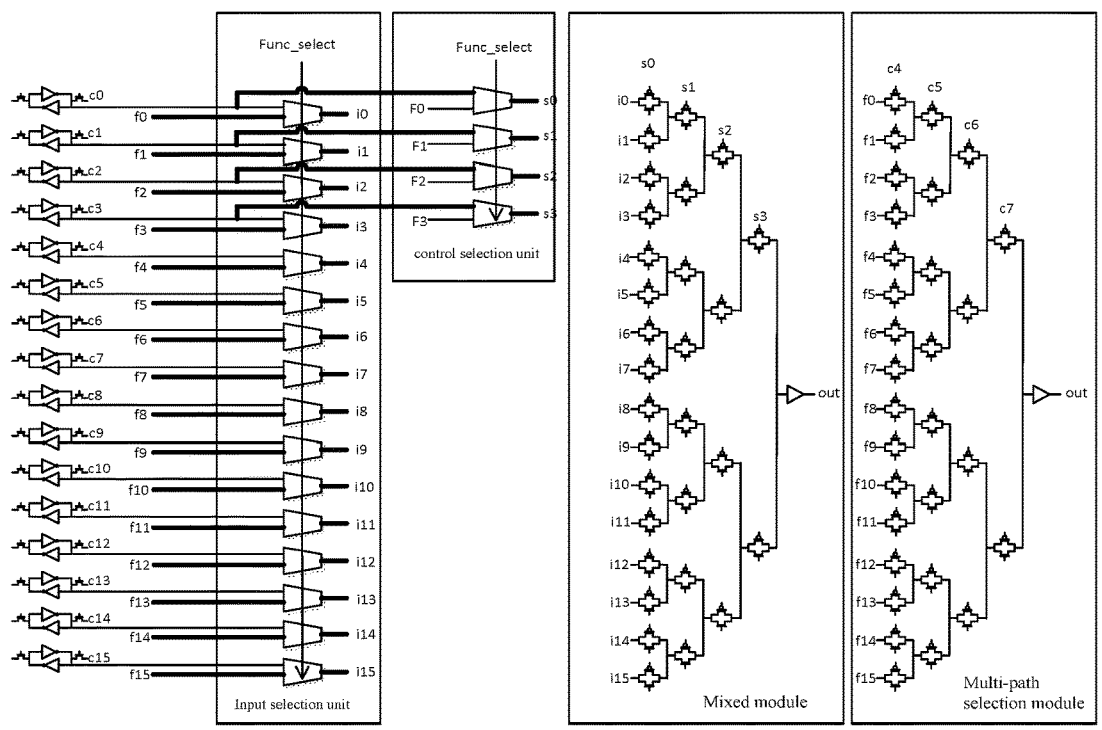
FIG. 6 is a schematic diagram of the mixed function unit for achieving a routing function in an embodiment of the invention.

FIG. 6 is a schematic diagram of the mixed function unit for achieving a routing function in an embodiment of the invention.

In one embodiment, as shown in FIG. 6, signal transmission between the mixed function unit and the storage unit when the routing function is achieved is highlighted in bold. In this embodiment, 0 is selected as a first flag bit, and 1 is selected as a second flag bit. When the selection control bit is 1, the one-out-of-two MUXs in the input selection unit select external input signal f0-f15 as outputs i0-i15, and the one-out-of-two MUXs in the control selection unit select SRAM bits c0-c3 as outputs s0-s3. At this moment, the mixed module serves as multiplexers to work together with the multi-path selection module.

The COMS transmission gates in the first layer of the mixed module receive output signals i0-i15 from the input selection unit, wherein the values of i0-i15 are external input signal f0-f15. Every two adjacent COMS transmission gates in the first layer form a group, have opposite connection directions, and achieve the one-out-of-two function according to a control signal s0. The second layer includes eight COMS transmission gates, receiving terminals of the eight COMS transmission gates receive output results from the first layer, and the one-out-of-two function is achieved according to a control signal s1. By analogy, the fourth layer includes two COMS transmission gates which receive output results from the COMS transmission gates in the third layer and achieve the one-out-of-two function according to a control signal s3, so that a unique result is output. Wherein, the values of s0-s3 are SRAM bits c0-c3, and the values of the input signals i0-i15 are external input signal f0-f15, that is, the mixed module achieves the function of one-out-of-sixteen MUXs controlled by the SRAM bits. The inputs of the multi-path selection module are the same as the inputs of the mixed function, and the control signals of the multi-path selection module are SRAM bits c4-c7. Sixteen SRAM bits are configured in this embodiment, another two multi-path selection modules (not shown) can also be configured as actually needed, the inputs of these two multi-path selection modules are identical with the inputs of the mixed module, and the control signals of these two multi-path selection modules are respectively c8-c11 and c12-c15. Each one-of-out-sixteen MUX realizes one type of gating by means of four values c0-c3, c4-c7, c8-c11 or c12-c15 which are pre-stored in the SRAM, and different MUXs can obtain different gating results under different input conditions according to the SRAM. As can be seen, the sixteen SRAM bits can control four one-of-out-sixteen MUXs.

Clearly, the sixteen SRAM bits are configured in this embodiment to achieve the function of four one-of-out-sixteen MUXs to the maximum extent, and those skilled in the art would appreciate that 2n SRAM bits can be configured, wherein $n=2^x$, and x is a natural number, and that k layers of COMS transmission gates can be configured to achieve the function of 2n one-out-of-two MUXs controlled by k control signals, wherein k=1+k. m multi-path selection modules can be configured as needed, but the number of the control signals should not be over 2n, that is, mk≤2n.

According to the circuit of the invention, the storage unit is selected to achieve a logic function or a multi-path selection function according to the selection control bit. The subsequent logic part can be implemented by means of a hardware description language. In one embodiment, the logic part is implemented by means of Verilog.

The objectives, technical solutions and advantages of the invention are further expounded in the aforesaid specific implementations. It should be understood that the aforesaid implementations are only specific ones, and are not intended to limit the protection scope of the invention. Any modifications, equivalent substitutions and improvements made on the basis of the spirit and principle of the invention should also fall within the protection scope of the invention.

What is claimed is:

1. A programmable device structure based on a mixed function storage unit, comprising a storage unit (SRAM) and a mixed function unit, wherein:
   the storage unit comprises n register units and at least one selection control bit, wherein $n=2^x$, and x is a natural number; and
   the register units are selected according to the selection control bit; when the mixed function unit is selected by the selection control bit to serve as a lookup table, a logic function is achieved; or, when the mixed function unit is selected by the selection control bit to serve as a multiplexer, a routing function is achieved;
   wherein the mixed function unit comprises an input selection unit, a control selection unit, a mixed module and a multi-path selection module, wherein:
   the input selection module comprises 2n one-of-out-two units, and two input terminals of the 2n one-of-out-two units are connected to the register units in a one-to-one correspondence manner to output mixed input bits; and
   the control selection unit comprises k one-of-out-two units, wherein k=1+x, first input terminals of the k one-of-out-two units are correspondingly connected to the register units, and second input terminals of the k one-of-out-two units receive external input signals and output mixed selection bits.

2. The structure according to claim 1, wherein when the selection control bit is a first flag bit, the mixed function unit is used as a lookup table to achieve the logic function; and when the selection control bit is a second flag bit, the mixed function unit is used as the multiplexer to achieve the routing function.

3. The structure according to claim 1, wherein the mixed module comprises k layers of COMS transmission gates;
   a first layer includes 2n COMS transmission gates, wherein every two adjacent said COMS transmission gates form a group, an input terminal of a first COMS transmission gate in each group is forward connected to an output of the input selection unit, and an input terminal of a second COMS transmission gate in each group is reversely connected to an output of the input selection unit, and output terminals of the two COMS transmission gates in each group are connected to serve as a common output of the whole group;
   a second layer includes n COMS transmission gates, wherein every two adjacent said COMS transmission gates form a group, an input terminal of a first COMS transmission gate in each group is forward connected to a set of outputs from the first layer, a second COMS transmission gate in each group is reversely connected to another set of outputs from the first layer, and output terminals of the two COMS transmission gates in each group are connected to serve as a common output of the whole group; and
   by analogy, a $k^{th}$ layer includes two COMS transmission gates, wherein an input terminal of a first COMS transmission gate is forward connected to a set of outputs from the previous layer, a second COMS transmission gate is reversely connected to another set of outputs from the previous layer, and output terminals of the two COMS transmission gates are connected to serve as a common output.

4. The structure according to claim 3, wherein each of the k layers of COMS transmission gates in the mixed module is controlled by one said mixed selection bit to be gated.

5. The structure according to claim 1, wherein the multi-path selection module comprises x multiplexers:
   each said multiplexer comprises k layers of COMS transmission gates, wherein:
   a first layer includes 2n COMS transmission gates, wherein every two adjacent said COMS transmission gates form a group, an input terminal of a first COMS transmission gate in each group forward receives an external routing input signal, an input terminal of a second COMS transmission gate in each group reversely receives an external routing input signal, output terminals of the two COMS transmission gates in each group are connected to serve as a common output of the whole group;

a second layer includes n COMS transmission gates, wherein every two adjacent said COMS transmission gates form a group, an input terminal of a first COMS transmission gate in each group is forward connected to a set of outputs from the first layer, a second COMS transmission gate in each group is reversely connected to another set of outputs from the first layer, and output terminals of the two COMS transmission gates in each group are connected to form a common output of the whole group; and by analogy, a $k^{th}$ layer includes two COMS transmission gates, an input terminal of a first COMS transmission gate is forward connected to a set of outputs from the previous layer, a second COMS transmission gate is reversely connected to another set of outputs from the previous layer, and output terminals of the two COMS transmission gates are connected to serve as a common output.

6. The structure according to claim 5, wherein each of the k layers of COMS transmission gates in the multi-path selection module is controlled by the storage unit to be gated.

* * * * *